United States Patent [19]

Mori et al.

[11] 4,032,945
[45] June 28, 1977

[54] LIGHT EMITTING SEMICONDUCTOR DIODE

[75] Inventors: Mitsuhiro Mori, Kokubunji; Kazuhiro Ito, Tokyo; Makoto Morioka, Tokyo; Yuichi Ono, Tokyo, all of Japan

[73] Assignee: Hitachi, Ltd., Japan

[22] Filed: July 30, 1976

[21] Appl. No.: 710,307

[30] Foreign Application Priority Data

July 30, 1975 Japan ............................. 50-91909

[52] U.S. Cl. .............................. 357/18; 357/17; 357/55; 357/16
[51] Int. Cl.² .................. H01L 33/00; H01L 33/19
[58] Field of Search ............... 357/17, 18, 55, 16

[56] References Cited

UNITED STATES PATENTS

| | | | |
|---|---|---|---|
| 3,303,432 | 2/1967 | Garfinkel | 331/94.5 |
| 3,697,336 | 10/1972 | Lamorte | 148/171 |
| 3,711,789 | 1/1973 | Dierschke | 331/94.5 P |
| 3,790,868 | 2/1974 | Soshea | 317/235 R |
| 3,974,514 | 8/1976 | Kressel | 357/17 |
| 3,991,339 | 11/1976 | Lockwood | 313/499 |

OTHER PUBLICATIONS

Alferov, Soviet Physics, Semiconductors, vol. 3, No. 9, Mar. 1970.
Namizaki et al., Journ. of Appl. Physics, vol. 45, No. 6, June 1974.

*Primary Examiner*—Martin H. Edlow
*Attorney, Agent, or Firm*—Craig & Antonelli

[57] ABSTRACT

A light emitting semiconductor diode comprises a first semiconductor region having a first conductivity type and a narrow forbidden band gap, a second semiconductor region, disposed on the first semiconductor region, having the first conductivity type and a low impurity concentration, a third semiconductor region, disposed on the second semiconductor region, having a second conductivity type which is opposite to the first conductivity type, and an ohmic contact disposed on the surface of the first semiconductor region, which is opposite to the second semiconductor region. The surface has a plurality of holes extending from the outer surface through the first semiconductor region toward a p-n junction between the second and third semiconductor regions, which holes are filled with a highly reflective metal having a high thermal conductivity.

14 Claims, 7 Drawing Figures

LIGHT EMITTING SEMICONDUCTOR DIODE

BACKGROUND OF THE INVENTION

1. Field of the Invention

The present invention relates to a light emitting semiconductor diode made of a III - V compound semiconductor, such as GaAs and $Ga_{1-x}Al_xAs$.

2. Description of the Prior Art

In conventional light emitting diodes, light generated at a p-n junction formed in a semiconductor body and emitted toward one side of the p-n junction, where the forbidden band gap is wider than that at the p-n junction, can emerge from the semiconductor body into the air, and light emitted toward the other side of the p-n junction is absorbed or scattered by semiconductor material wherein the forbidden band gap is narrower than at the p-n junction and by an ohmic contact formed on a surface of the semiconductor layer and provides little or no contribution to the light output. This lowers the emission efficiency. Furthermore, another disadvantage is that heat generated at the p-n junction gives rise to a large temperature increase, which, in turn, lowers the internal quantum efficiency. An example of this type of light emitting semiconductor diode is described in U.S. patent application Ser. No. 612,282.

In order to reflect part of the light at the position of the ohmic contact, several new types of semiconductor diodes have been proposed. In one, an $SiO_2$ layer deposited on the surface of the semiconductor body has a plurality of perforations. A metal electrode is deposited on the $SiO_2$ layer and through the perforations on the surface of the semiconductor body and forms an ohmic contact. Part of the light emitted toward the ohmic contact is reflected by the $SiO_2$ layer and enhances external quantum efficiency. In another diode, the surface of the semiconductor body has a plurality of grooves and a metal electrode is in contact with the surface only where no grooves are formed, so that part of light is reflected at the bottom of the grooves. These structures can enhance external quantum efficiency, but incident light nearly normal to the surface of the semiconductor body is reflected neither at the bottom of the grooves nor at the surface of the $SiO_2$ layer. Another disadvantage is that the dissipation of heat generated at the p-n junction is as poor as that of conventional semiconductor diodes.

SUMMARY OF THE INVENTION

An object of this invention is, therefore, to provide a light emitting semiconductor diode, free of the above-mentioned disadvantages and which will permit extraction of a large part of light from the semiconductor body and at the same time dissipating heat generated at the p-n junction efficiently.

In order to achieve this object, the light emitting semiconductor diode comprises a first semiconductor region having a high impurity concentration and first conductivity type and a narrow forbidden band gap, a second semiconductor region, disposed on the first semiconductor region, having the first conductivity type and a low impurity concentration, a third semiconductor region, disposed on the second semiconductor region, having a second conductivity type which is opposite to the first conductivity type, and an ohmic contact disposed on the surface of the first semiconductor region, which is opposite to the second semiconductor region, the surface of which has a plurality of holes extending from the outer surface through the first semiconductor region toward a p-n junction between the second and third semiconductor regions, which holes are filled with a highly reflective metal having a high thermal conductivity.

DETAILED DESCRIPTION

Figure 1:
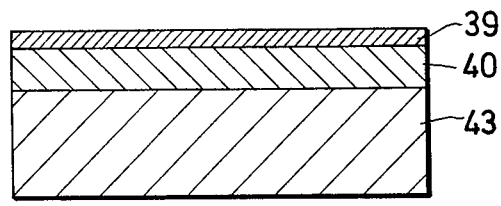
FIGS. 1 to 5 are cross-sectional views representing a process for fabricating a light emitting semiconductor diode according to the invention.

As is shown in FIG. 1, two semiconductor layers 39, 40 are formed on a semiconductor substrate 43 using conventional semiconductor technology. The first layer 39, of $n$ conductivity type GaAs doped with Te about 1μm thick, has a high impurity concentration ($5 \times 10^{18}$ cm$^{-3}$) and a narrow forbidden band gap. The second layer 40, of $Ga_{0.7}Al_{0.3}As$ doped with Sn about 2μm thick, has an impurity concentration ($1 \times 10^{18}$ cm$^{-3}$) lower than that of the first layer 39. The substrate 43 of $Ga_{1-x}Al_xAs$ ($x \geq 0.3$) doped with Zn about 150μm thick has an impurity concentration of $1 \times 10^{18}$ cm$^{-3}$. The second and third layers form a p-n junction 41 therebetween. The first layer 39 has a high impurity concentration and a narrow forbidden band so that the metal electrodes disposed thereon can form good ohmic contact with the first layer. On the other hand, the second layer 40 has a low impurity concentration so that a high internal quantum efficiency can be obtained. The substrate has a crystal composition ratio $x$ giving a forbidden band gap determined by the wavelength of the light to be obtained near the p-n junction 41. The crystal composition ratio increases with increasing distance from the p-n junction.

Figure 2:
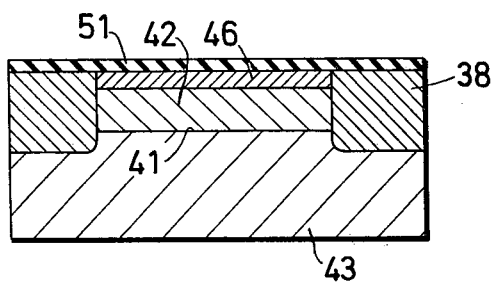

Ring-shaped portions of layers 39 and 40 are transformed into $p$ conductivity type by selectively diffusing zinc so as to form a high impurity concentration $p$ conductivity type layer 38 about 5μm thick, as illustrated in FIG. 2. The remaining parts of the first and second layers having a diameter of about 160μm form the first and second semiconductor regions 46 and 42, respectively.

A phosphosilicate glass film 51 having a thickness of between 4000 and 6000 A is desposited on the first region 46 and the high impurity concentration $p$ conductivity type layer 38.

A number of perforations are formed in the central part of the phosphosilicate glass film 51 on the first region 46 by well-known photolithographic techniques. A preferable arrangement of the perforations will be described subsequently.

Figure 3:
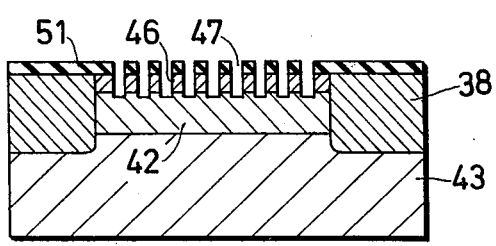
Figure 4:
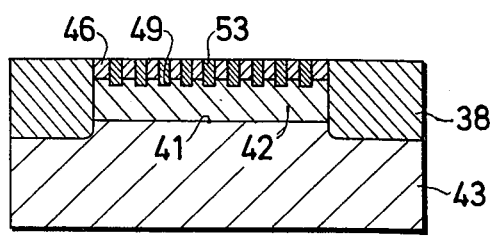
Figure 5:
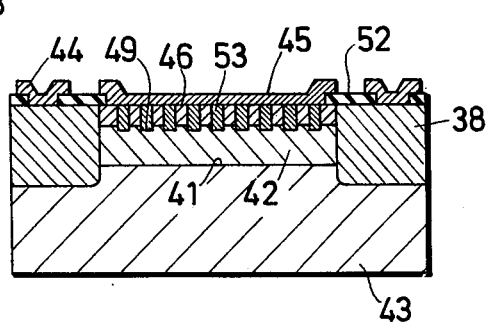
Figure 6:
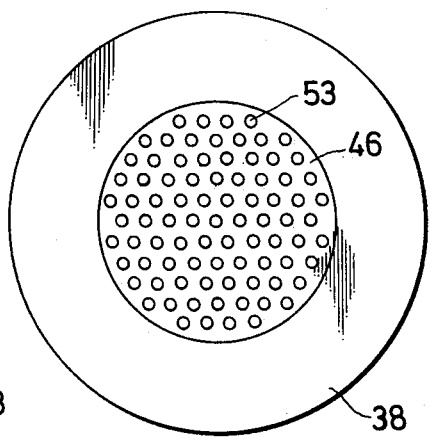
FIG. 6 is a plan view of the semiconductor body represented in FIG. 4.

By using the phosphosilicate glass film 51 as a mask, holes 47, which are 1.2 to 1.5μm deep, i.e. which pass through the first region 46 and reach the second region 42, are formed by chemical etching, as shown in FIG. 3. An etching solution of $H_2SO_4 : H_2O_2 : C_2H_4(OH)_2 = 1 : 2 : 7$ can be used for this purpose for example. After having removed the phosphosilicate glass film 51, an Ag layer is deposited on the entire surface by evaporation. Adhesive tape is affixed to the surface of the Ag layer and then removed. The part of the Ag layer which is outside of the holes 47 is removed together with the adhesive tape, so that Ag remains only in the holes 47, i.e. the holes are filled with Ag 53, as indicated in FIG. 5. The same result can be obtained with an Ag layer deposited by galvanization.

A new phosphosilicate glass film 52 is deposited on the surface and a circular window is formed in the film over the first region 46 by the photolithographic method. Three metal layers AuGe-Ni-Au or AuGe-Cr-Au are deposited successively on the exposed surface of the first region 46 and the remaining phosphosilicate glass film 52 at a temperature of 200° C by vacuum evaporation.

The sample thus obtained is heat treated at a temperature of 400° C for 1.5 minutes in a hydrogen stream atmosphere to form a good ohmic contact. Then the metal layers are selectively etches, so that a negative electrode 45 is formed on the first region 46.

Next, another window, which is ring-shaped, is formed in the phosphosilicate glass film 52 on the high impurity concentration $p$ conductivity type layer 38 and an ohmic contact for the positive electrode 44 made of AuSbZn-Au is formed on the exposed surface of the high impurity concentration $p$ conductivity type layer 38 at a temperature of 450° C by a method similar to that used for the formation of the negative electrode.

In the light emitting semiconductor diode thus constructed, the extremities of the holes filled with Ag constitute light reflection surfaces 49. Since these light reflection surfaces 49 are in the second semiconductor region 42 constituting the p-n junction 41 with the substrate 43, light generated at the p-n junction 41 and directed toward the bottom of the holes filled with Ag is not absorbed by the first region 46 having a narrow forbidden band gap before reaching the light reflection surfaces. Since the holes 47 are filled with highly reflective metal having a high thermal conductivity, such as Ag, the interface between the second semiconductor region 42 and the metal acts as a good light reflection surface 49. Not only is the light output enhanced, because a light beam close to a normal to the surface, which would be transmitted in the prior art devices utilizing total reflection between a semiconductor body and air or an SiO$_2$ film, is also reflected, but also heat generated at the p-n junction is well dissipated through Ag filling the holes and the metal electrode to the outside of the semiconductor body, because the thermal conductivity of Ag is 8 times as great as that of the semiconductor material.

In the above described example, Ag is used as a light reflective metal. This is not only because it has a high reflection coefficient in the wavelength range between 7600 and 10,000A and a high thermal conductivity, but also because it doesn't react with a III-V compound semiconductor such as GaAs and GaAlAs at a temperature range between 380° and 450° C, to which it is heated during the heat treatment for forming an ohmic contact, so that the reflection coefficient is decreased. Au, Al, Ni, Pt, Cr, and their alloys can be used for the III-V compound semiconductors for this purpose.

It is preferable to distribute the holes filled with Ag as uniformly as possible, in order that the temperature distribution be as uniform as possible. For this purpose as many holes as possible and as small as possible are filled with Ag and distributed as uniformly as possible. The lower limit of the diameter and the distance between the holes filled with Ag is determined by the precision of the photolithographic technique. This lower limit is about 5$\mu$m. The holes are preferably circular, because of the anisotropy of the III-V compound semiconductors. In order to distribute as many small circular holes having a predetermined minimum distance between them in a predetermined area as possible, the center of the holes should be at the vertices of equilateral triangles, the length of each side of which is equal to the sum of the predetermined minimum distance and the diameter of the holes, covering an area as indicated in FIG. 5. For example, in the case where holes filled with Ag having a diameter of 6$\mu$m are arranged with a distance measured from periphery to periphery of 10$\mu$m in the above described manner, the ratio of the light reflection surface of the total area of the p-n junction is 23% and light output is increased by a factor of 1.2. Since thermal conductivity is increased by 2.7 by the Ag filling the holes, the temperature increase at the p-n junction is suppressed to 20° - 30° C as compared to a temperature rise of 30° - 40° C for the same type of light emitting diodes, except that they are not provided with holes filled with Ag. Degradation of internal quantum efficiency is, therefore, prevented. The distance between and the diameter of the holes filled with Ag should be smaller than 20$\mu$m. Otherwise the internal quantum efficiency decreases with increasing drive time, which is probably due to the non-homogeneity of the temperature distribution at the p-n junction, i.e. to a localized high temperature. The distance between and the diameter of the holes filled with Ag are preferably smaller than 10$\mu$m.

Figure 7:
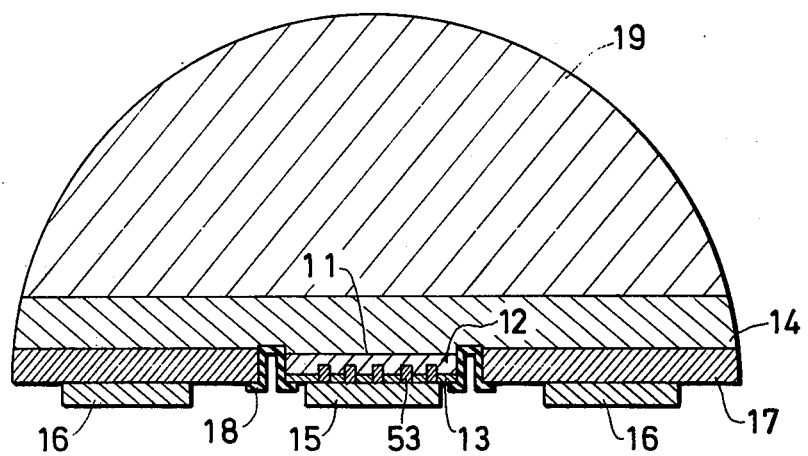
FIG. 7 is a cross-sectional view of another light emitting semiconductor diode according to the invention.

This invention is applicable to a hemispherical light emitting semiconductor diode described in USP. application Ser. No. 612,282. FIG. 7 shows a cross-sectional view of this new type of light emitting semiconductor diode.

Semiconductor regions 12, 13, 14 and 17 are formed just as described in the above embodiment. They are the same as the semiconductor regions 42, 46, 43 and 38, respectively, except that the semiconductor region 14 is about 20$\mu$m thick and has a constant composition ratio of Ga$_{0.7}$Al$_{0.3}$As. A p-n junction 11 having a diameter of about 160$\mu$m is formed between the regions 12 and 14. The semiconductor region 14 has a diameter of about 600$\mu$m.

The $n$ conductivity type GaAs region 13 has a plurality of holes filled with Ag 53, extending into the $n$ conductivity type Ga$_{0.7}$Al$_{0.3}$As region 12 and arranged just as described in the above embodiment. On the holes filled with Ag and the exposed surface of the $n$ conductivity type GaAs layer 13 there is disposed an ohmic contact 15 having a diameter of about 130$\mu$m for an electrode. A ring-shaped ohmic contact 16 is disposed on the exposed surface of the Zn diffused region 17 for the other electrode. A hemispherical region 19 consists of a mixed compound semiconductor, whose forbidden band gap is substantially equal to that of the $p$ conductivity type region 14 at the boundary with it and increases with increasing distance from the $p$ conductivity type region 14, so that light generated at the p-n junction 11 can pass through the hemispherical region 19. The hemispherical region 19 has a diameter of about 600$\mu$m and, therefore, a height of about 300$\mu$m. The $n$ conductivity type regions 12 and 13 are bounded by a ring-shaped ditch, the surface of which is covered by a phosphosilicate glass layer 18. This ditch eliminates the curved portion of the p-n junction and serves to stabilize the electric characteristics of the p-n junction.

The external quantum efficiency of this type of diode is 25%, while that of the same type of diode having no holes filled with Ag is 15%.

While we have shown and described several embodiments in accordance with the present invention it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:
1. A light emitting semiconductor diode comprising:
    a first semiconductor region having a first conductivity type and a narrow forbidden band gap,
    a second semiconductor region, abutting said first semiconductor region, having the first conductivity type and a low impurity concentration,
    a third semiconductor region, abutting said second semiconductor region, having a second conductivity type which is opposite to the first conductivity type,
    a first ohmic contact disposed on the surface of said first semiconductor region, which is opposite to the surface thereof abutting said second semiconductor region,
    a second ohmic contact on a surface of said third semiconductor region, which is not opposite to the surface thereof abutting said second semiconductor region,
    a plurality of holes extending from the outer surface of and through said first semiconductor region toward a p-n junction between said second and third semiconductor regions, which holes are filled with a metal which is both highly reflective and has a high thermal conductivity.

2. A light emitting semiconductor diode according to claim 1, wherein said first semiconductor region is made of GaAs and said second and third semiconductor regions are made of $Ga_{1-x}Al_xAs$ where $x \geq 0.3$.

3. A light emitting semiconductor diode according to claim 1, wherein said metal filling said holes is a metal selected from the group consisting of Ag, Au, Al, Ni, Pt, Cr and their alloys.

4. A light emitting semiconductor diode according to claim 1, wherein said metal filling said holes is Ag.

5. A light emitting semiconductor diode according to claim 1, wherein said holes are circular and so arranged that both the diameter and the distance measured from periphery to periphery of said holes are between 5 and 20μm.

6. A light emitting semiconductor diode according to claim 5, wherein said circular holes are at the vertices of equilateral triangles covering a predetermined area on which said ohmic contact is disposed.

7. A light emitting semiconductor diode according to claim 1, wherein said holes are circular and so arranged that both the diameter and the distance measured from periphery to periphery of said holes are between 5 and 10μm.

8. A light emitting semiconductor diode according to claim 1, wherein said first and second semiconductor regions are embedded in the central portion of a first surface of said third semiconductor region, so that the surface of said first region and a ring-shaped exposed part of said first surface of said third semiconductor region are substantially coplanar and a further including fourth semiconductor region made of a mixed compound semiconductor disposed on a second surface of said third semiconductor region, which is opposite to said first surface, the forbidden band gap of which increases with increasing distance from said second surface, said fourth semiconductor regions being substantially hemispherical, the center of the hemisphere being substantially at the center of said second surface.

9. A light emitting semiconductor diode according to claim 8, wherein the ring-shaped portion of said third semiconductor region has a relatively high impurity concentration.

10. A light emitting semiconductor diode according to claim 9, wherein said ring-shaped portion of said third semiconductor region is separated from said first and second semiconductor regions by an annular ditch.

11. A light emitting semiconductor diode according to claim 8, wherein said first semiconductor region is made of GaAs and said second and third semiconductor regions are made of $Ga_{0.7}Al_{0.3}As$.

12. A light emitting semiconductor diode according to claim 8, wherein said holes are circular and so arranged that both the diameter and the distance measured from periphery to periphery of said holes are between 5 and 20μm.

13. A light emitting semiconductor diode according to claim 12, wherein said circular holes are at the vertices of equilateral triangles covering a predetermined area on which said ohmic contact is disposed.

14. A light emitting semiconductor diode according to claim 8, wherein said holes are circular and so arranged that both the diameter and the distance measured from periphery to periphery of said holes are between 5 and 10μm.

* * * * *